US008521979B2

(12) United States Patent
LaBerge et al.

(10) Patent No.: US 8,521,979 B2
(45) Date of Patent: Aug. 27, 2013

(54) MEMORY SYSTEMS AND METHODS FOR CONTROLLING THE TIMING OF RECEIVING READ DATA

(75) Inventors: Paul A. LaBerge, Shoreview, MN (US); James B. Johnson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 665 days.

(21) Appl. No.: 12/128,883

(22) Filed: May 29, 2008

(65) Prior Publication Data
US 2009/0300314 A1 Dec. 3, 2009

(51) Int. Cl.
*G06F 12/00* (2006.01)
*G06F 13/00* (2006.01)
*G06F 13/28* (2006.01)

(52) U.S. Cl.
USPC ............................ 711/167; 711/105; 711/150

(58) Field of Classification Search
USPC .................................. 711/105, 150, 167–169
See application file for complete search history.

(56) References Cited

U.S. PATENT DOCUMENTS

| | | | |
|---|---|---|---|
| 5,179,303 A | 1/1993 | Searles et al. | |
| 5,263,032 A | 11/1993 | Porter et al. | 371/40.2 |
| 5,748,914 A | 5/1998 | Barth et al. | |
| 5,774,475 A | 6/1998 | Qureshi | |
| 5,960,008 A | 9/1999 | Osawa et al. | 371/22.31 |
| 5,982,684 A | 11/1999 | Schwartzlow et al. | |
| 6,052,329 A | 4/2000 | Nishino et al. | 365/233 |
| 6,122,688 A | 9/2000 | Barth et al. | 710/100 |
| 6,181,616 B1 | 1/2001 | Byrd | |
| 6,247,138 B1 | 6/2001 | Tamura et al. | |
| 6,285,211 B1 | 9/2001 | Sample | |
| 6,363,017 B2 | 3/2002 | Polney | 365/189.02 |
| 6,401,213 B1 * | 6/2002 | Jeddeloh | 713/401 |
| 6,519,194 B2 | 2/2003 | Tsujino et al. | 365/201 |
| 6,574,626 B1 | 6/2003 | Regelman et al. | 707/6 |
| 6,650,157 B2 | 11/2003 | Amick et al. | |
| 6,839,260 B2 | 1/2005 | Ishii | |
| 6,882,304 B2 | 4/2005 | Winter et al. | 342/128 |
| 6,889,334 B1 * | 5/2005 | Magro et al. | 713/500 |
| 6,907,555 B1 | 6/2005 | Nomura et al. | 714/719 |
| 7,058,865 B2 | 6/2006 | Mori et al. | 714/724 |
| 7,107,424 B1 * | 9/2006 | Avakian et al. | 711/167 |
| 7,135,905 B2 | 11/2006 | Teo et al. | 327/231 |

(Continued)

FOREIGN PATENT DOCUMENTS

| | | |
|---|---|---|
| JP | 05-265872 | 10/1993 |
| JP | 11-102599 | 4/1999 |

(Continued)

OTHER PUBLICATIONS

Search Report dated Mar. 11, 2013 for TW Application No. TW 098114848.

(Continued)

*Primary Examiner* — Ryan Bertram
(74) *Attorney, Agent, or Firm* — Dorsey & Whitney LLP (57) ABSTRACT

Embodiments of the present invention provide memory systems having a plurality of memory devices sharing an interface for the transmission of read data. A controller can identify consecutive read requests sent to different memory devices. To avoid data contention on the interface, for example, the controller can be configured to delay the time until read data corresponding to the second read request is placed on the interface.

22 Claims, 6 Drawing Sheets

(56) References Cited

U.S. PATENT DOCUMENTS

| | | |
|---|---|---|
| 7,149,134 B2 | 12/2006 | Streif et al. ............ 365/194 |
| 7,168,005 B2 | 1/2007 | Adams et al. ............ 714/31 |
| 7,184,916 B2 | 2/2007 | Resnick et al. ............ 702/118 |
| 7,197,101 B2 | 3/2007 | Glenn et al. |
| 7,203,259 B2 | 4/2007 | Glenn et al. ............ 375/354 |
| 7,389,375 B2 | 6/2008 | Gower et al. ............ 710/310 |
| 7,489,743 B2 | 2/2009 | Koh et al. ............ 375/327 |
| 7,567,476 B2 | 7/2009 | Ishikawa ............ 365/219 |
| 7,697,369 B2 | 4/2010 | Koshizuka |
| 7,710,144 B2 | 5/2010 | Dreps et al. ............ 326/30 |
| 7,764,564 B2 | 7/2010 | Saito et al. |
| 7,855,931 B2 | 12/2010 | LaBerge et al. |
| 7,979,757 B2 | 7/2011 | Jeddeloh ............ 714/718 |
| 8,010,866 B2 | 8/2011 | Laberge |
| 8,127,204 B2 | 2/2012 | Hargan |
| 8,289,760 B2 | 10/2012 | Jeddeloh |
| 8,356,138 B1 | 1/2013 | Kulkarni et al. |
| 8,400,808 B2 | 3/2013 | King |
| 2002/0004893 A1 | 1/2002 | Chang ............ 711/170 |
| 2002/0054516 A1* | 5/2002 | Taruishi et al. ............ 365/189.05 |
| 2002/0097613 A1 | 7/2002 | Raynham ............ 365/200 |
| 2002/0125933 A1 | 9/2002 | Tamura et al. |
| 2002/0130687 A1 | 9/2002 | Duesman ............ 326/101 |
| 2002/0133666 A1 | 9/2002 | Janzen et al. |
| 2002/0138688 A1 | 9/2002 | Hsu et al. ............ 711/105 |
| 2003/0041299 A1 | 2/2003 | Kanazawa et al. ............ 714/766 |
| 2003/0132790 A1 | 7/2003 | Amick et al. |
| 2004/0073767 A1 | 4/2004 | Johnson et al. ............ 711/202 |
| 2004/0160833 A1* | 8/2004 | Suzuki ............ 365/194 |
| 2004/0168101 A1 | 8/2004 | Kubo |
| 2004/0199840 A1 | 10/2004 | Takeoka et al. ............ 714/727 |
| 2004/0206982 A1 | 10/2004 | Lee et al. ............ 257/200 |
| 2004/0237023 A1 | 11/2004 | Takahashi et al. ............ 714/768 |
| 2004/0246026 A1 | 12/2004 | Wang et al. ............ 326/86 |
| 2005/0071707 A1 | 3/2005 | Hampel |
| 2005/0091471 A1 | 4/2005 | Conner et al. ............ 711/220 |
| 2005/0144546 A1 | 6/2005 | Igeta et al. ............ 714/735 |
| 2005/0157560 A1 | 7/2005 | Hosono et al. ............ 365/185.22 |
| 2005/0278490 A1* | 12/2005 | Murayama ............ 711/154 |
| 2006/0036827 A1 | 2/2006 | Dell et al. |
| 2006/0123320 A1 | 6/2006 | Vogt |
| 2006/0126369 A1 | 6/2006 | Raghuram ............ 365/51 |
| 2006/0233012 A1 | 10/2006 | Sekiguchi et al. ............ 365/51 |
| 2006/0245291 A1 | 11/2006 | Sakaitani ............ 365/230.03 |
| 2006/0273455 A1 | 12/2006 | Williams et al. ............ 257/723 |
| 2007/0058410 A1 | 3/2007 | Rajan ............ 365/63 |
| 2007/0070669 A1 | 3/2007 | Tsern |
| 2007/0074093 A1 | 3/2007 | Lasser |
| 2007/0136645 A1 | 6/2007 | Hsueh et al. ............ 714/784 |
| 2007/0271424 A1 | 11/2007 | Lee et al. ............ 711/156 |
| 2008/0147897 A1 | 6/2008 | Talbot ............ 710/8 |
| 2008/0150088 A1 | 6/2008 | Reed et al. |
| 2008/0250292 A1 | 10/2008 | Djordjevic ............ 714/746 |
| 2009/0006775 A1 | 1/2009 | Bartley et al. ............ 711/154 |
| 2009/0016130 A1 | 1/2009 | Menke et al. ............ 365/201 |
| 2009/0021992 A1 | 1/2009 | Oh |
| 2009/0196093 A1* | 8/2009 | Happ et al. ............ 365/163 |
| 2009/0251189 A1 | 10/2009 | Hsieh |
| 2009/0300314 A1 | 12/2009 | Laberge et al. |
| 2009/0300444 A1 | 12/2009 | Jeddeloh ............ 714/719 |
| 2010/0005217 A1 | 1/2010 | Jeddeloh ............ 711/1 |
| 2010/0005376 A1 | 1/2010 | LaBerge et al. ............ 714/819 |
| 2010/0014364 A1 | 1/2010 | LaBerge et al. ............ 365/193 |
| 2010/0031129 A1 | 2/2010 | Hargan ............ 714/786 |
| 2010/0042889 A1 | 2/2010 | Hargan ............ 714/752 |
| 2010/0070696 A1 | 3/2010 | Blankenship ............ 711/105 |
| 2010/0079180 A1 | 4/2010 | Kim et al. |
| 2010/0091537 A1 | 4/2010 | Best et al. ............ 365/51 |
| 2010/0110748 A1 | 5/2010 | Best ............ 365/51 |
| 2011/0075497 A1 | 3/2011 | LaBerge et al. ............ 365/193 |
| 2011/0296227 A1 | 12/2011 | LaBerge et al. |
| 2012/0144276 A1 | 6/2012 | Hargan |
| 2012/0155142 A1 | 6/2012 | King |

FOREIGN PATENT DOCUMENTS

| | | |
|---|---|---|
| JP | 2004-327474 | 11/2004 |
| JP | 2007-140948 | 6/2007 |
| JP | 2007-226876 | 9/2007 |
| JP | 2007-328636 | 12/2007 |
| JP | 2008-112503 | 5/2008 |
| JP | 2008-140220 | 6/2008 |
| WO | WO-2007/038225 | 4/2007 |
| WO | WO-2007/095080 | 8/2007 |
| WO | WO-2008/054696 | 5/2008 |
| WO | WO-2008/076790 | 6/2008 |
| WO | WO-2009/148863 | 12/2009 |
| WO | WO-2010/002561 A2 | 1/2010 |
| WO | WO-2010/011503 A2 | 1/2010 |
| WO | WO-2012/060097 | 5/2012 |
| WO | WO-2012/082338 | 6/2012 |

OTHER PUBLICATIONS

Office Action dated Mar. 11, 2013 for TW Application No. 098114848.

* cited by examiner

FIG. 6 ns and addresses are transmitted on a separate interface (not shown) dedicated to command and address signals. –>

MEMORY SYSTEMS AND METHODS FOR CONTROLLING THE TIMING OF RECEIVING READ DATA

TECHNICAL FIELD

Embodiments of the invention relate to memory systems and methods for controlling memory devices.

BACKGROUND OF THE INVENTION

Processor-based systems use memory devices, such as dynamic random access memory ("DRAM") devices, to store data (e.g. representing instructions, data to be processed, etc.) that are accessed by the processor. In a typical computer system, the processor communicates with the system memory including the memory devices through a processor bus and one or more memory controllers. In some memory systems, a group of memory devices of the system memory are controlled by an associated memory controller. The processor issues to the memory controller a memory request including a memory command, such as a read command, and an address designating the location from which data are to be read from memory. The memory controller uses the command and address to generate appropriate memory commands as well as row and column addresses, which are applied to the memory devices associated with that memory controller. In response to the commands and addresses, data is transferred between the memory devices and the processor.

Memory devices require a certain amount of time to service a memory request due to the time necessary to access the appropriate rows and columns of the memory device and actually retrieve the requested data. Further time is required to drive read data and read commands onto and off of a common interface between the memory devices and the controller. Although the operating speed of memory devices is continually increasing, the increase in device speed has not kept pace with increases in the operating speed of processors. The operation of the memory device itself therefore often limits the bandwidth of communication between the processor and the system memory.

To improve overall memory access bandwidth, one memory controller typically controls access to more than one memory device. In some systems, the processor interfaces with several memory controllers, each of which in turn control access to several memory devices. In this manner, further memory commands may be issued by a processor or memory controller while waiting for a memory device to respond to an earlier command, and bandwidth is improved. When a memory controller shares a common interface with multiple memory devices however, timing problems may occur. Commands and addresses sent from the memory controller, which are represented by electrical signals coupled to conductive signal lines of the interface, may reach different memory devices at different times, depending on the layout of the memory system. Furthermore, different memory devices may take different amounts of time to respond to memory commands depending on the process variations that occurred during fabrication of the memory devices. Variations in temperature may also cause variation in response time between memory devices.

Accordingly, there is a danger of a conflict on the common interface between multiple memory devices and a memory controller. For example, one memory device may attempt to place read data on the interface at the same time as data from another memory device is being carried by the interface. Such a data collision would result in a loss of usable data and is unacceptable. This problem can be alleviated by providing a common clock signal to each memory device that is synchronized to a system clock signal used by the memory controller. Each memory device may then decide when to place data on the interface by counting received clock periods. By referencing a common clock signal the memory device can ensure it places data onto the bus during a clock cycle designated for its use. When the memory device places data onto the interface, it then also sends a data strobe signal for use by the controller in identifying and synchronizing received read data. The use of common clock signals for synchronizing operation of the memory devices and strobe signals may require additional circuitry and further pins on the memory device.

However, the transmission of clock signals for each memory device may increase complexity of the system and consumes space and power at the memory device. Further, it may be desirable to decrease the number of output pins on the memory device. What is needed is a system that avoids data collisions on a common interface but does not rely on the use of a common clock signal at the memory device.

DETAILED DESCRIPTION

Embodiments of the present invention are directed toward memory systems and methods for controlling memory devices. Certain details are set forth below to provide a sufficient understanding of embodiments of the invention. However, it will be clear to one skilled in the art that embodiments of the invention may be practiced without various of these particular details. In some instances, well-known circuits, control signals, timing protocols, and software operations have not been shown in detail in order to avoid unnecessarily obscuring the described embodiments of the invention.

Figure 1:
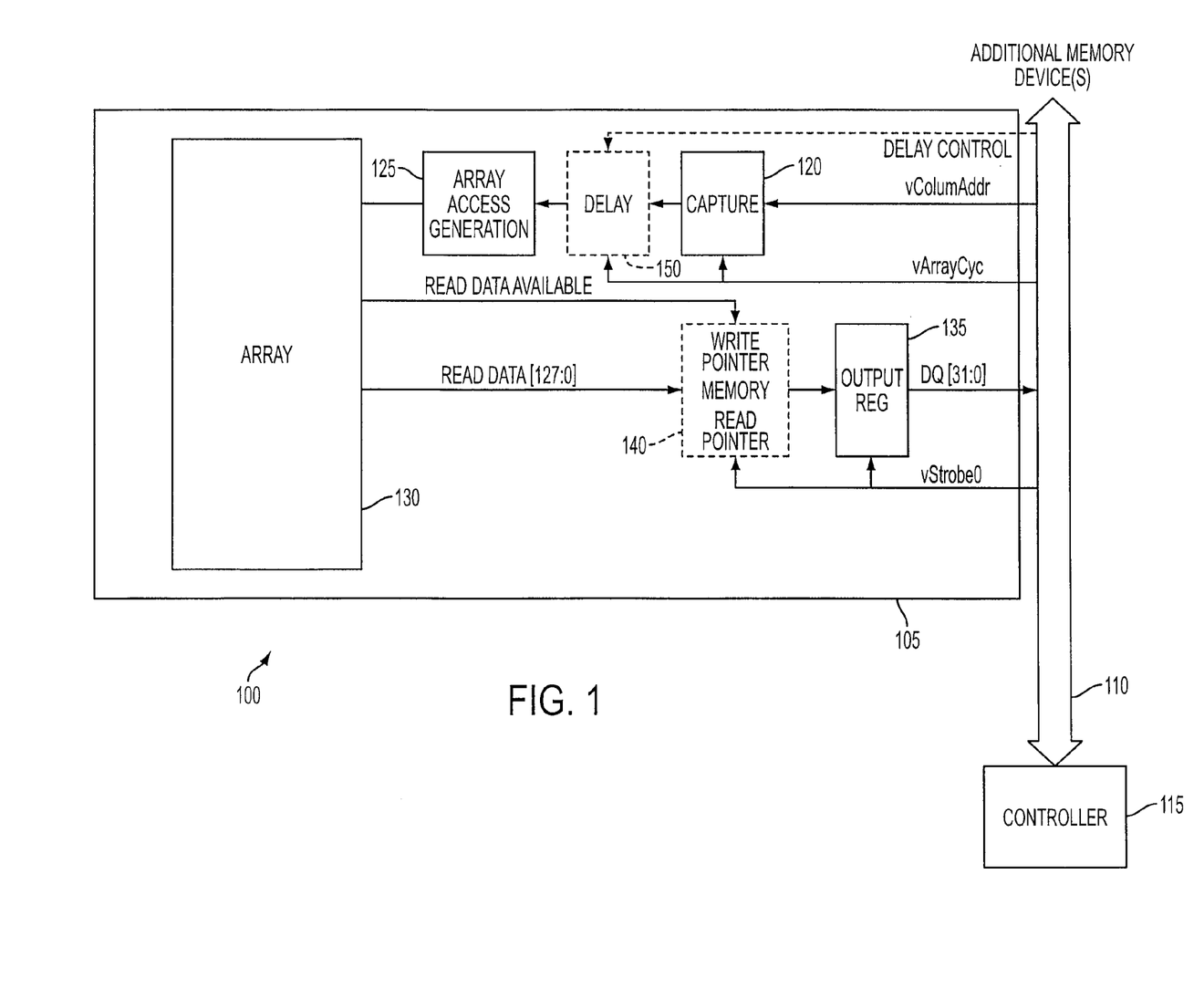
FIG. 1 is a simplified block diagram of a memory device according to an embodiment of the present invention.

A system 100 according to an embodiment of the present invention is shown in FIG. 1. The system 100 includes a plurality of memory devices, including memory device 105. The memory device 105 and other memory devices (not shown) share an interface 110 with a controller 115. The interface 110 may be implemented, for example, as a bus including a high-speed bus. In some embodiments, the memory device 105 may be physically stacked with one or more other memory devices and optionally also the controller 115. The interface 110 may then be implemented as a set of through-substrate interconnects. The through-substrate interconnects may be formed by metalizing through-substrate vias created in each memory device substrate, or by any other method.

The controller 115 is configured to transmit commands, addresses and data, which are represented as electrical signals, and control signals to the memory devices over the interface 110. In some embodiments, however, only data signals are transmitted on the shared interface 110 and command or address signals, or both may be transmitted over another interface. The controller transmits a variety of commands to ensure proper operation of the memory devices. The controller determines when to transmit commands using a controller clock signal.

A read operation will now be described to generally illustrate operation of the system 100. The controller 115 transmits a read command onto the interface 110. Read commands for the memory device 105 (shown in FIG. 1 as vColumAddr) are captured in a capture buffer 120. The read command is latched in capture buffer 120 by access signal, vArrayCyc, which transmitted by the controller 115 to a control input of the capture buffer 120. By adjusting the timing of the vArrayCyc signal, the controller 115 can adjust when the read command is output from the capture buffer 120. The read command is then passed to an access generation circuit 125 which generates internal control signals to access the array of memory cells 130 to retrieve read data. It takes a certain access time, $t_{ACL}$, from the time vArrayCyc is transmitted to the memory device until the time the corresponding memory cell is accessed and the read data becomes available. The read data is placed in an output register 135 until an output control signal, vStrobe0, is transmitted by the controller 115 to a control input of the output register 135, at which time the read data is moved from the output register 135 onto the interface 110 for communication with the controller 115. The output control signal vStrobe0 is specific for the memory device 105 and does not cause data to be coupled to the interface 110 from any of the other memory devices in the system 100.

Data may be read from the array 130 in a burst manner. After specifying an initial address, data from several memory cells in the array 130 may be read sequentially. A larger amount of data may be read from the array 130 than can be placed on the interface 110 at one time. In such a case, the read data is serialized for transmission on the interface 110. For example, as indicated in FIG. 1, 128 bits of data may be read from the array 130 and serialized into 32 bit groups for transmission on the interface 110.

As will be described in more detail below, the functional blocks shown in FIG. 1 in dashed lines (for example, delay 150 and memory 140) may be included in other embodiments of the invention, and can be optionally included depending on which embodiment of the invention is desired.

As described above with reference to FIG. 1, the controller 115 generates commands and addresses for several memory devices, including the memory device 105. Because the different devices may be placed different distances from the controller 115, the commands, addresses, and control signals, such as vColumAddr, vArrayCyc, and the memory device-specific vStrobe may take different amounts of time to reach each memory device. Further, the memory arrays associated with each memory device may have a different access time, $t_{ACL}$, due to process or temperature variations. These timing differences between memory devices could cause read data from more than one device to be applied to the shared interface simultaneously if the memory devices apply the data to the interface at the time it becomes ready. Some delay can be used when reading from different memory devices consecutively. Delay can also be used between a read and a write request, either to a same or different memory devices.

Figure 2:
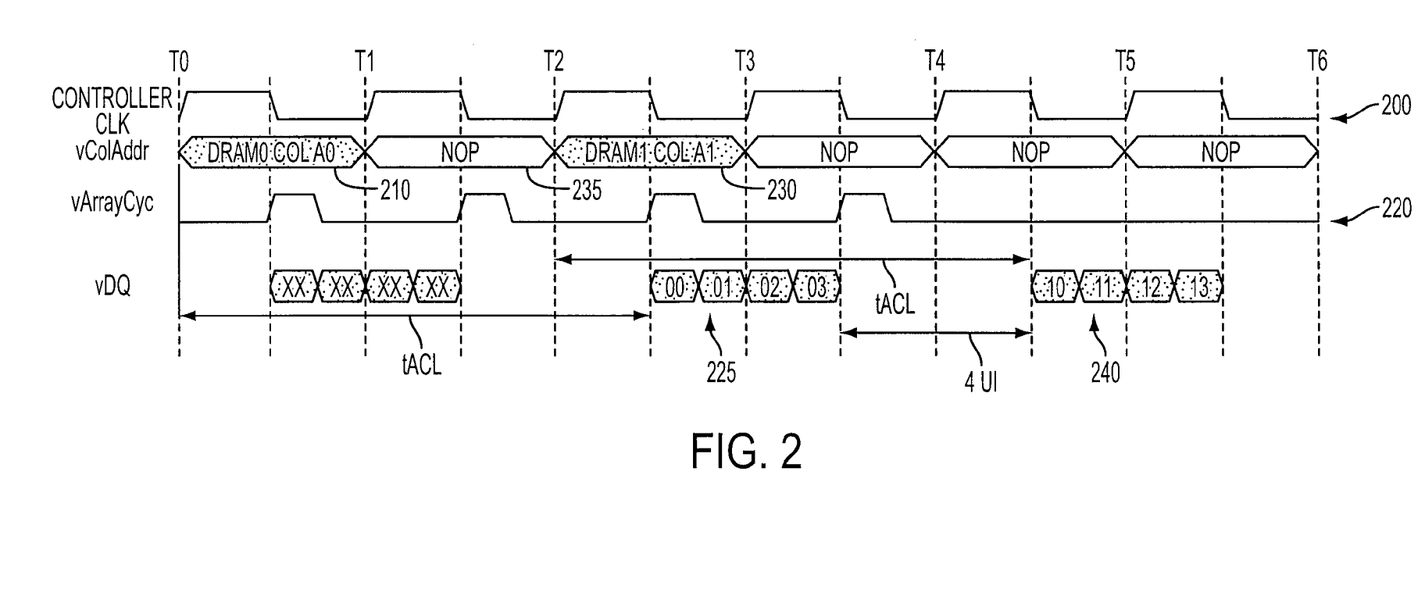
FIG. 2 is a timing diagram illustrating various signals during operation of a conventional timing protocol.

In an example of a conventional timing protocol implemented by the system of FIG. 1, the controller 115 may be configured to delay a read command sent to a different memory device by a complete controller clock cycle. An example of the timing for this delay is shown in FIG. 2. The controller clock signal 200 is shown to illustrate the relative timing. The controller transmits a read command 210 for retrieving data from a first memory device, DRAM0, at time T0. Although DRAM devices are discussed as examples herein, any type of memory may generally be used. The controller transmits an array access signal vArrayCyc 220 to cause the memory devices to capture the command, as described above. As shown in FIG. 2, the vArrayCyc signal 220 contains a positive pulse corresponding to a high to low transition of the controller clock signal 200. Read data will be available in the output register 135 a time $t_{ACL}$ after the command is transmitted, as shown in FIG. 2 mid-way between T2 and T3. At that time, read data 225 is available to be placed on the interface 110.

Read data is output by the memory in a certain unit time interval. A unit time interval corresponds to a single data transmission. The example in FIG. 2 illustrates a system having quad-data rate devices and a burst length of four. A quad-data rate device can output read data four times every clock cycle. A burst length of four results in data from four consecutive memory locations being returned following the single read command 210. The data from the four different locations are shown in FIG. 2 as read data 225 (labeled '00, 01, 02, 03'). As a result of the quad-data rate devices, the unit time interval for the embodiment of FIG. 2 corresponds to one-quarter of the controller clock period. Although a quad-data rate memory is described, any data rate may generally be used, including single or double data rate.

The next read command 230 is directed to a different memory device, DRAM1. If the read command were directed to the same memory device as the read command 210, the controller could transmit the command immediately following the initial read command 210, at time T1. However, because the read command 230 is directed to a different memory device (i.e., DRAM1), the controller delays transmission of the read command 230 by one controller clock period, shown as the "no operation" (NOP) command 235 in FIG. 2. The data requested by the read command 230 is available for readout at time $t_{ACL}$ later, a time between T4 and T5 as shown in FIG. 2. By waiting a clock cycle between the transmission of read command 210 and read command 230, there are now four unit time intervals between the time all four data—00, 01, 02 and 03—(from a first memory device) are available for retrieval, and the time a first data is available responsive to the second read command 230—(from a second memory device) shown as data 240 in FIG. 2. These four unit time intervals are sufficient to account for the variable time the commands, addresses, and control signals take to reach the different memory devices and different access times for the different devices to avoid data collision on the interface 10. Accordingly, a data strobe signal (not shown) may be sent to the second memory device to place the first data of data 240 onto the interface 110 as soon as the data is ready, shown as a time between T4 and T5 in FIG. 2.

The method described with reference to FIG. 2 delays the transmission of a read command when the read command is directed to a different memory device than the previously issued read command. That is, a memory device transition occurs when consecutive read commands are transmitted by the controller to different memory devices. The controller then delays the time corresponding read data from the later read command is placed on the interface. A memory device transition may be to a new memory device or back to a previously accessed memory device. For example, a first read command to DRAM0 followed by a second read command to DRAM1 would be a memory device transition. If the next read command is to DRAM0 or DRAM2 or any other memory device besides DRAM1, that is also a memory device transition. Any number of consecutive commands to a same memory device may be issued between memory device transitions. In the embodiment of FIG. 2, in summary a conventional timing protocol may be implemented where an entire controller clock cycle of delay is inserted between successive read commands transmitted to different devices. While this timing ensures proper operation despite signal transmission and access time differences between the memory devices, it decreases bandwidth in some embodiments. For example, in a single data rate system where the data rate is matched to the controller clock rate, the bandwidth penalty is equal to 1/(1+BL) where BL is the burst length. Using an exemplary burst length of 4, the bandwidth penalty is thus ⅕ or 20%. That is, in a worst-case bandwidth scenario, where each read command is issued to a different memory device than the last read command, and a controller clock is inserted between each one, there would be four controller clock cycles to retrieve the four data elements in the burst length, and one extra clock cycle of wait time. In a double data-rate system where data may be transmitted at a leading and falling edge of a clock signal, the bandwidth penalty is equal to 2/(2+BL). Assuming a burst length of 4, the penalty is ⅓ or roughly 33.33%. This corresponds to a scenario where each subsequent read command is sent to a different memory device, it takes two controller clocks to transfer the four elements of read data in the burst, and one extra controller clock is inserted prior to the next read command. In a quad-data rate system, assuming a burst length of four, the bandwidth penalty is greater still at 4/(4+BL), that is, the bandwidth penalty is 50%.

Figure 3:
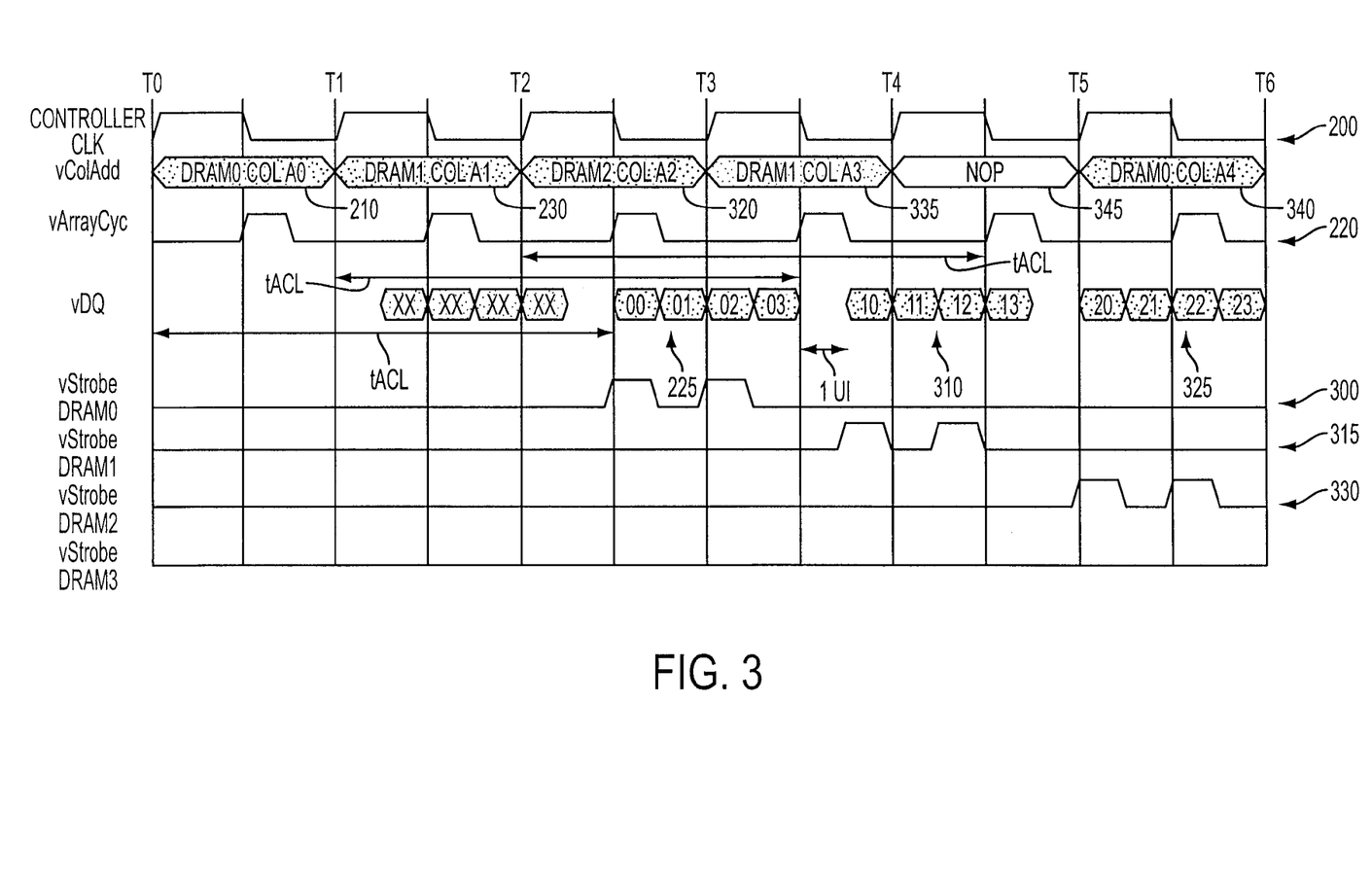
FIG. 3 is a timing diagram illustrating various signals during operation of another embodiment of the present invention.

One or more embodiments of the present invention reduce the bandwidth penalty associated with the operation of the system 100. It may not be necessary to insert a full controller clock period in between consecutive reads to different memory devices. The variation in travel time for signals to different devices and the variation in access time for the devices may be such that one unit time interval of time delay is sufficient. Accordingly, some embodiments of the invention delay the retrieval of available read data from a memory device by one unit time interval when consecutive read commands are issued to different devices. An example of a timing diagram illustrating such an embodiment is shown in FIG. 3. A read command 210 is transmitted at time T0 to a first memory device, DRAM0. The vArrayCyc signal 220 causes the memory device to capture the read command 210. The associated read data 225 becomes available a time $t_{ACL}$ later, between T2 and T3 in FIG. 3. The read data 225 may be read out at that time using the vStrobe signal 300 for DRAM0. When the next read command 230 is transmitted at time T1 to DRAM1 in FIG. 3, the associated data 310 becomes available a time $t_{ACL}$ later, between T3 and T4 in FIG. 3. However, the vStrobe signal 315 for DRAM1 is delayed one unit time interval following $t_{ACL}$, that is, one-quarter of the controller clock period in the example of FIG. 3. Accordingly, one unit time interval separates the time read data 225 is finished being output (from DRAM0) to the interface 110 and the time the read data 310 (from DRAM1) may begin being placed onto the interface 110. The single unit time interval, one-quarter the clock period in FIG. 3, is sufficient in many cases to account for variations in signal transit time and access time variations to avoid data collision on the interface 110.

The next read command 320 is also transmitted to a different memory device than the previous read command 230. In FIG. 3, the read command 320 is destined for DRAM2. The vStrobe signal 330 for DRAM2 is accordingly delayed yet another unit time interval, for a total of a two unit time interval delay following $t_{ACL}$. The read data 325 (from DRAM2) associated with the read command 320 is available at a time $t_{ACL}$ after the read address 320 is sent, shown in FIG. 3 as between T4 and T5. However, the vStrobe signal 330 is not transmitted until two unit time intervals later, at time T5. This again leaves a one unit time interval separation between the time the last of the data 310 have been placed on the interface 110 and the time the first of the data 325 may be placed onto the interface 110. The next read command 335 is transmitted at time T3, representing a read command transmitted to DRAM1. Since the read command 335 is directed to a different device that the previous read command 320, the vStrobe signal for DRAM1 will be delayed another one unit time interval, for a total of a three unit time interval delay beyond $t_{ACL}$. The vStrobe signal and read data corresponding to the read command 335 are not shown on FIG. 3, however, for ease of illustrating the remainder of the timing diagram. The next read command 340 is directed to DRAM0, and again represents a change of memory device relative to the previous read command 335. The vStrobe signal for DRAM0 will accordingly be delayed an additional unit time interval, for a total for four unit time intervals. However, recall that a unit time interval in FIG. 3 corresponds to one-quarter of the controller clock period. Accordingly, instead of delaying a vStrobe signal for DRAM0 by four unit time intervals, the controller may simply delay transmission of the next read command by one controller clock, as shown by the NOP command 345. The vStrobe signal for DRAM0 corresponding to the read command 340 may then be transmitted at time $t_{ACL}$ after T5 (i.e., without any vStrobe delay), when the read command was transmitted 340.

Each consecutive read command 210, 230, 320, 335, and 340 in FIG. 3 is directed to a different memory device than the previous signal for ease of illustrating timing techniques for operation of some embodiments of the invention. When consecutive read commands are transmitted to the same memory device, however, the delay for sending a corresponding vStrobe signal is not increased. By way of summary, a vStrobe signal is generally transmitting to retrieve read data and access time, $t_{ACL}$, after transmitting the read command. When the destination memory device changes relative to the previous read command, the vStrobe signal is delayed by one unit time interval and is transmitted one unit time interval after $t_{ACL}$ has elapsed. This timing of the vStrobe signal is maintained until a read address is transmitted to a different memory device, at which time the vStrobe signal is delayed two unit time intervals, and so on. Once a delay of four unit time intervals is needed, the controller simply waits one controller clock period before transmitting the read command. In this manner, assuming an exemplary burst length of four, the bandwidth penalty for a single data rate system is at most 1/16 or approximately 6%. One-quarter clock period is used as delay following each four data elements. So, after transmitting 16 data elements, an entire clock period of delay has been used. In the embodiment shown in FIG. 3, one-quarter clock period is used as the delay increment. In other embodiments, however, other time periods could be used such that instead of progressively delaying the vStrobe signal by one unit time interval, a fraction of the time interval is used, such as one-half a unit time interval. Each time a read command is transmitted to a different memory device, the vStrobe signal is delayed an additional delay increment. Once the total delay equals a controller clock period, issuance of the next read command to a different memory device is delayed by a clock period.

As shown in FIG. 3, a data strobe signal may be delayed relative to a time when the read data has been accessed from the memory array and is available for transmission on the interface 110. The data should be stored during this delay period. Furthermore, additional data may be accessed from the memory array 130 during the delay period. Accordingly, a buffer memory 140 (FIG. 1) can be included in the memory device 105. In some embodiments, the buffer memory 140 may be positioned generally anywhere between the array 130 and the interface 110. The buffer memory 140 stores the retrieved read data from the memory array 130 until such time as the vStrobe signal is received. The buffer memory 140 can have sufficient memory to store as much data as may be retrieved from the array 130 during the delay of the vStrobe signal. Accordingly, in one embodiment of the buffer memory 140 includes a FIFO memory capable of storing additional groups of read data. Generally, the longest delay of the vStrobe signal in the embodiment of FIG. 3 is three unit time intervals, during which an additional memory request could be serviced by the array while data from the previous read access is applied to the data bus. Accordingly, the buffer memory 140 is capable of storing an additional group of read data.

The buffer memory 140 may include a read and a write pointer to indicate where data can be written and where data can be read. The vStrobe signal causes data to be transmitted from the output register 135 to the interface 110, as described above. The vStrobe signal may also cause the read pointer of the buffer memory 140 to increment, passing the next stored data to the output register 135. The memory array 130 may transmit a data strobe signal to the buffer memory 140 when read data is available, incrementing the write pointer such that the retrieved data is written to correct locations. In summary, operation of an embodiment of the invention as discussed above with reference to FIG. 3 should improve the bandwidth penalty incurred to avoid conflicts on the interface 110 by delaying vStrobe signals a unit time interval each time a different memory device is addressed. However, a buffer memory 140 may be used to store the data retrieved from the memory array 130 during the delay of the vStrobe signal.

Figure 4:
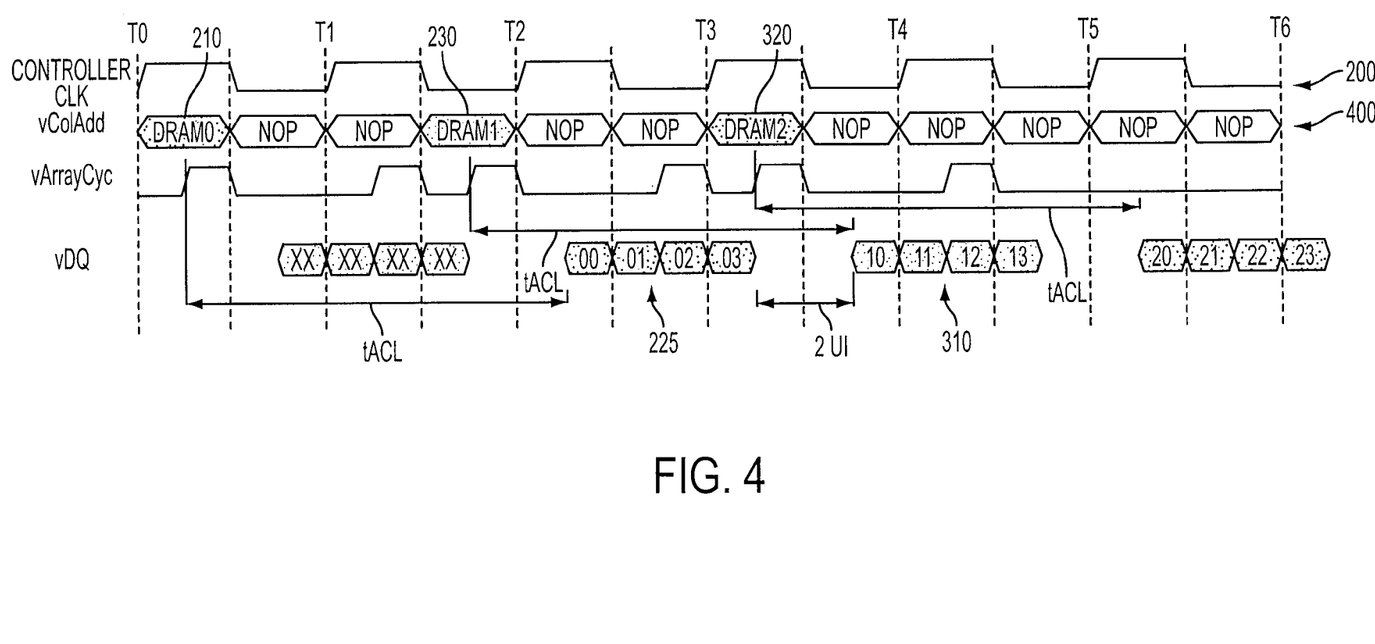
FIG. 4 is a timing diagram illustrating various signals during operation of another embodiment of the present invention.

Another embodiment of the present invention may reduce the required memory in the buffer memory 140. Recall the buffer memory 140 has sufficient memory to store read data that may be obtained from the array 130 during a period the vStrobe signal is delayed, which may be as much as three unit time intervals in one embodiment. To reduce the size of the buffer memory 140, or in some embodiments, eliminate a need for the buffer memory 140, timing of the transmission of read commands may be varied instead of the timing of the strobe signal, as shown in FIG. 4. In this embodiment, the controller again utilizes the controller clock signal 200. However, the controller can transmit read commands 400 at a higher speed, able to transmit one address command during each half-period of the controller clock 200. A first read command 210 is transmitted at time T0. If a next read command corresponds to the same memory device, the signal is sent at time T1, one controller clock period later. However, if the next read command is for a different memory device, as shown in FIG. 4 by the read command 230 transmitted to DRAM1, the read command is delayed an extra two unit time intervals, one-half a controller clock period in FIG. 3. Accordingly, the read command 230 is transmitted between time T1 and T2 as shown. Read data associated with the address 210 becomes available an access time $t_{ACL}$ after the read command 210 is sent, and a vStrobe signal (not shown) for DRAM0 may be transmitted at that time, between T2 and T3 in FIG. 4, to retrieve the data 225. By waiting two unit time intervals into the clock cycle T1, the first of data 310 (from DRAM1) associated with the read command 230 becomes available two unit time intervals after the last of data 225 (from DRAM0) has been placed onto the interface 110. The data 310 may be retrieved by transmitting a vStrobe command (not shown in FIG. 4) for DRAM1 at the time the data 310 is available, between T3 and T4 in FIG. 4.

In this manner, read commands are transmitted by the controller either four unit time intervals or six unit time intervals apart. A subsequent read command may be transmitted four unit time intervals following the transmission of a previous read command when reading from a same memory device, and six unit time intervals following issuance of a previous read command when reading from a different memory device. The vArrayCyc signal is changed to transmit pulses both four and six unit time intervals after an transmitted read command, as shown in FIG. 4, to latch a subsequent read command. Accordingly, the memory devices are able to capture a read command transmitting in either timing slot. Since data can be retrieved from the memory device $t_{ACL}$ after the read command is transmitted, less space is required in the buffer memory 140, as the read data will not need to be stored an additional amount of time on the memory device.

As discussed above with reference to FIG. 4, read commands may be delayed an extra two unit time intervals when the read commands are directed to a different memory device than the previous read command. In another embodiment of the invention, a timing margin of one unit time interval can be provided when switching between different memory devices by delaying processing of a subsequent read command. Referring back to FIG. 1, in some embodiments of the present invention a delay circuit 150 is optionally included in the memory device 105 between the capture circuit 120 and the array access generation circuit 125. The delay circuit 150 delays the application of a received command to the array access generation circuit 125, which as previously discussed, generates internal control signals to initiate access to the array of memory cells 130 and retrieve read data. In one embodiment, the delay circuit 150 receives the vArrayCyc signal. A read command is captured by the capture circuit 120 on a rising edge of the vArrayCyc signal, but is delayed by the delay circuit 150 until a falling edge of the vArrayCyc signal to be provided to the access generation circuit 125. This delays the signal by the width of the vArrayCyc pulse, one unit time interval in the example described now with reference to FIG. 5.

Figure 5:
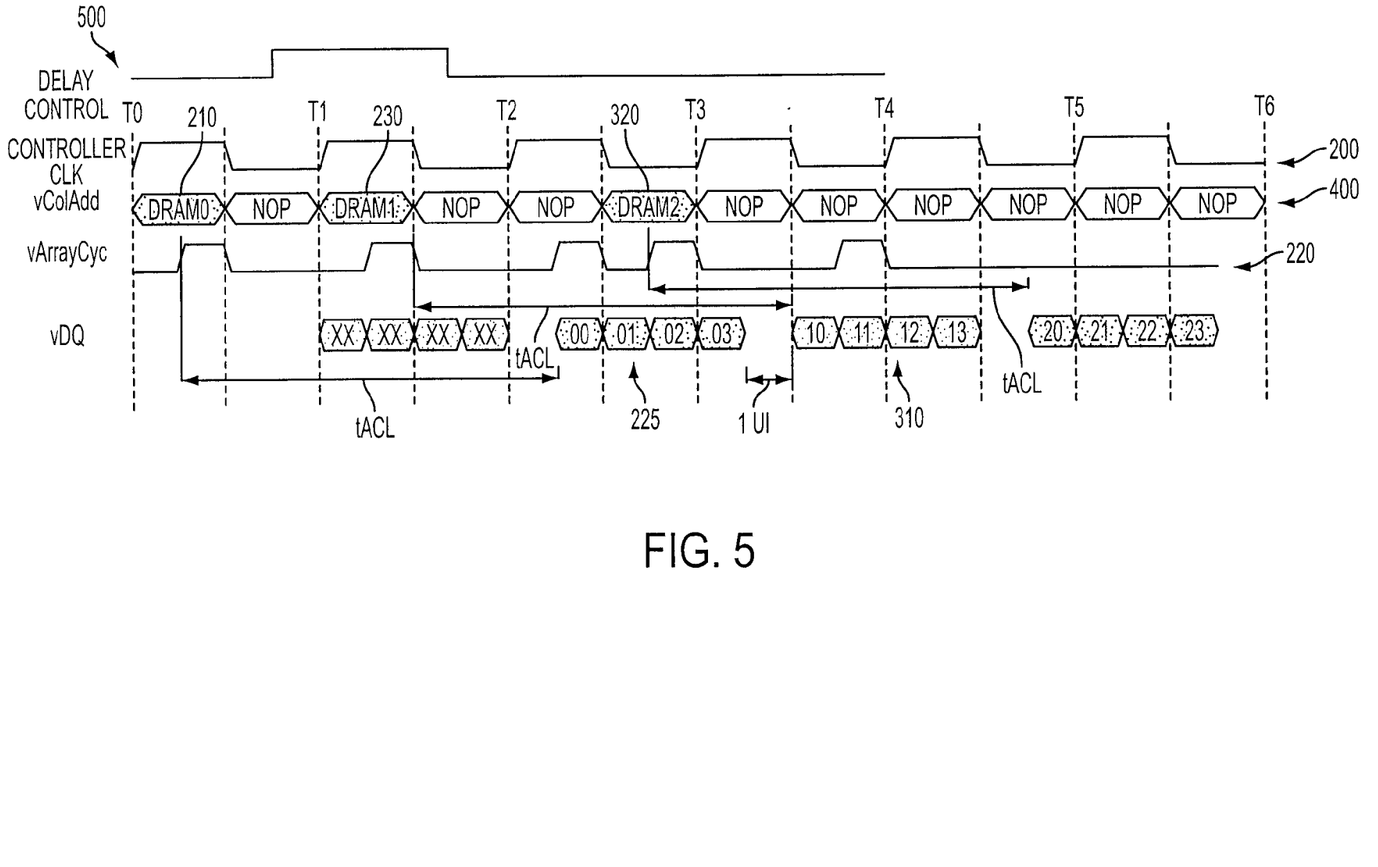
FIG. 5 is a timing diagram illustrating various signals during operation of another embodiment of the present invention.

A delay control signal 500 is provided to the delay circuit 150 to indicate whether the delay circuit 150 should be used to delay the command signal. When the delay control signal 500 is low, the read command 210 will be captured by the DRAM0 on a rising edge of the vArrayCyc signal 220, at a time shortly after T0 in FIG. 5, and passed to the array access generation circuit 125 to begin retrieval of the read data. The associated data 225 are placed onto the interface 110 a time $t_{ACL}$ later, shortly after T2 in FIG. 5. Additional read commands may then be transmitted to the same memory device without additional delay. However, the next read command shown in FIG. 5, read command 230, is directed to a different memory device, DRAM1. The delay control signal 500 goes high and the read command 230 will be captured on a rising edge of the vArrayCyc signal, but forwarding of the read command 230 to the array access generation circuit 125 will be delayed by the delay circuit 150 until a falling edge of the vArrayCyc signal. The associated data 310 is placed on the interface 110 a time $t_{ACL}$ after the falling edge of the vArrayCyc signal, as shown in FIG. 5. In this manner, the placement of the data on the interface is delayed by the width of the vArrayCyc signal, that is, one unit time interval in FIG. 5. In other embodiments, any interval or fraction of an interval may be used, such as half a unit time interval.

When a read command is again transmitted to a different memory device, the command itself may be delayed by two unit time intervals, as shown by read command 320 in FIG. 5 and is generally described above with reference to FIG. 4. By way of summary, the first time a different memory device is accessed, the device itself may create a one unit time interval delay by delaying application of the incoming read command to the array access generation circuit to initiate the read operation. The next time a different memory device is accessed, the command itself may be delayed two unit time intervals before transmission to the memory device. Then, the next time a different memory device is accessed, the memory device itself may delay the command, and so on.

Figure 6:
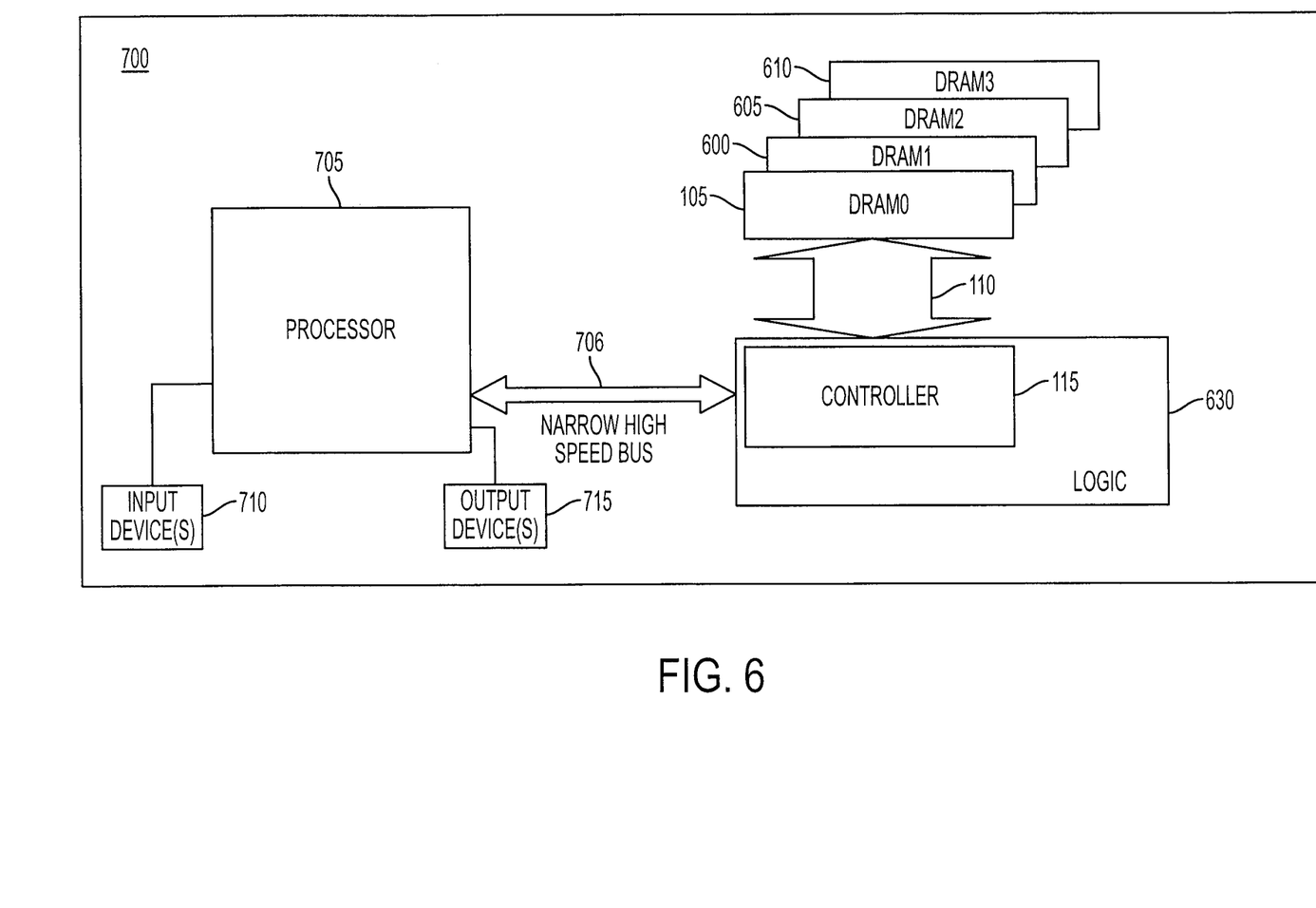
FIG. 6 is a simplified block diagram of a processor-based system according to an embodiment of the present invention.

An embodiment of a processor-based system 700 according to the present invention is shown in FIG. 6. The controller 115 communicates with multiple memory devices 105, 600, 605 and 610 over an interface 110. Although four memory devices are shown in FIG. 6, the controller 115 may communicate with any number. The interface 110 may be any type of interface, as described above. In some embodiments, however the memory system shown in FIG. 6 is implemented as a physical stack, with each memory device 105, 600, 605, 610 fabricated on a semiconductor substrate, and the semiconductor substrates placed one on top of the other. The interface 110 may then be implemented using a series of through-silicon vias. Although DRAM devices are shown in FIG. 6, any type of memory device may be used alternatively or in addition to the devices shown.

The controller 115 may be part of a larger logic die 630 that may communicate with a processor 705 through a relatively narrow high-speed bus 706 that may be divided into downstream lanes and separate upstream lanes (not shown in FIG. 6). The DRAM devices 105, 600, 605 and 610 may be stacked on top of the logic die 630 which serves as the interface with the processor 705. The logic die 630 can implement a variety of functions to limit the number of functions that must be implemented in the DRAM devices. For example, the logic die 630 may perform memory management functions, such power management and refresh of memory cells in the DRAM devices 105, 600, 605 and 610. In some embodiments, the logic die 630 may implement test and/or repair capabilities, and it may perform error checking and correcting ("ECC") functions.

The DRAM devices 105, 600, 605 and 610 are connected to each other and to the logic die 630 by a relatively wide interface 110. The interface 110 may be implemented using through silicon vias ("TSVs"), as described above, which allow for formation of a large number of conductors extending through the DRAM devices 105, 600, 605, 610 at the same locations and connect to respective conductors formed on the devices 105, 600, 605, 610 to form vertical interfaces. In one embodiment, each of the DRAM devices 405, 600, 605, 610 are divided into 16 autonomous partitions, each of which may contain 2 or 4 independent memory banks. In such case, the partitions of each device 105, 600, 605, 610 that are stacked on top each other may be independently accessed for read and write operations. Each set of 16 stacked partitions may be referred to as a "vault." Thus, memory device 105 may contain 16 vaults. In one embodiment, the controller 115 is coupled to one vault through the interface 110 and a separate controller is provided for other vaults in the devices 105, 600, 605, 610.

The computer system 700 includes a processor 705 for performing various computing functions, such as executing specific software to perform specific calculations or tasks. The processor 705 may be coupled to input devices 710, or output devices 715, or both. In some cases, a device may perform both an input and output function. Any type of input and output devices may be used such as storage media, keyboards, printers and displays. The processor generally communicates with the controller 115 over a processor bus 706, and may communicate address, command, and data signals. The controller then communicates with the memory devices over a further interface, as discussed above.

From the foregoing it will be appreciated that, although specific embodiments of the invention have been described herein for purposes of illustration, various modifications may be made without deviating from the spirit and scope of the invention.

What is claimed is:

1. A memory system comprising:
a plurality of memory devices, each including a respective array of memory cells, each of the plurality of memory devices configured to access data from a respective array of memory cells in response to capturing a respective read command, each memory device further configured to capture the respective read command at least partially responsive to an array access signal and output the respective read data corresponding to the respective read command responsive to a respective output control signal;
an interface coupled to each of the plurality of memory devices, the interface configured to receive the respective read data output from each of the plurality of memory devices; and
a controller operating according to a controller clock signal having a controller clock period coupled to the plurality of memory devices through the interface, the controller configured to transmit the respective read commands to the plurality of memory devices, the controller further configured to transmit the array access signal to the plurality of memory devices and transmit the respective output control signal for each of the plurality of memory devices, at least partially responsive to transmitting first and second consecutive read commands to two different ones of the plurality of memory devices, the controller configured to delay a time when read data corresponding to the second consecutive read command is transmitted on the interface by less than one controller clock period.

2. The memory system of claim 1 wherein each of the plurality of memory devices further comprises a buffer memory coupled to the respective array of memory cells, the buffer memory configured to store respective read data during the delay time.

3. The memory system of claim 1 wherein the controller is configured to delay the time when read data corresponding to the second consecutive read command is coupled to the interface by delaying a time the respective output control signal is transmitted to the different one of the plurality of memory devices by a delay time.

4. The memory system of claim 3 wherein the delay time is one unit time interval.

5. The memory system of claim 3 wherein the delay time is a fraction of one unit time interval.

6. The memory system of claim 3 wherein the controller is further configured to transmit a third consecutive read command to a memory device different than the memory device to which the second consecutive read command was transmitted, the controller configured to delay the time when read data corresponding to the third consecutive read command is coupled to the interface by delaying a time the respective output control signal is transmitted by two times the delay time.

7. The memory system of claim 6 wherein the controller is further configured to transmit a fourth consecutive read command to a memory device different than the memory device to which the third consecutive read command was transmitted, the controller configured to delay the time when read data corresponding to the fourth consecutive read command is coupled to the interface by delaying a time the respective output control signal is transmitted by three times the delay time.

8. The memory system of claim 7 wherein the delay time is one-quarter of the controller clock period, the controller further configured to transmit a fifth consecutive read command to a memory device different than the memory device to which the fourth consecutive read command was transmitted, the controller configured to delay the time when read data corresponding to the fifth consecutive read command is coupled to the interface by delaying transmission of the later consecutive read command by a controller clock period.

9. The memory system of claim 1, the controller configured to transmit consecutive read commands to a same memory device during consecutive controller clock periods, the controller configured to delay the time when read data corresponding to the second consecutive read command directed to the different one of the plurality of memory devices is coupled to the interface by delaying the transmission of the second consecutive read command by one-half a controller clock period.

10. The memory system of claim 9 wherein the controller is configured to transmit read commands in one-half a controller clock period.

11. The memory system of claim 1 wherein the controller is further configured to delay the time when read data corresponding to the second consecutive read command is coupled to the interface by transmitting a delay control signal, the memory device corresponding to the second consecutive read command configured to delay application of the second consecutive read command to the corresponding memory array responsive to the delay control signal.

12. The memory system of claim 11 wherein the array access signal includes a rising edge and a falling edge, and wherein the memory device corresponding to the second consecutive read command is configured to capture the second consecutive read command on the rising edge of the array access signal and store the second consecutive read command until the falling edge of the array access signal.

13. The memory system of claim 11 wherein the plurality of memory devices each include a respective delay circuit, the delay circuit configured to receive the array cycle signal and store the second consecutive read command until the falling edge of the array cycle signal.

14. The memory system of claim 1 wherein each of the plurality of memory devices are carried by a respective semiconductor substrate, wherein the plurality of respective semiconductor substrates are arranged in a physical stack, the interface comprising through-substrate interconnects.

15. A processor-based system comprising:
a processor configured to generate read commands;
a memory system coupled to the processor, the memory system comprising:
a plurality of memory devices, each including a respective array of memory cells, each of the plurality of memory devices configured to access data from a respective array of memory cells in response to capturing a respective read command, each memory device further configured to capture the respective read command responsive to an array access signal and output the respective read data corresponding to the respective read command at least partially responsive to a respective output control signal;
an interface coupled to each of the plurality of memory devices, the interface configured to receive the respective read data output from each of the plurality of memory devices; and
a controller operating according to a controller clock signal having a controller clock period coupled to the plurality of memory devices through the interface, the controller configured to transmit the respective read commands to the plurality of memory devices, the controller further configured to transmit the array access signal to the plurality of memory devices and transmit the respective output control signal for each of the plurality of memory devices, at least partially responsive to transmitting first and second consecutive read commands to two different ones of the plurality of memory devices, the controller configured to delay a time when read data corresponding to the second consecutive read command is transmitted on the interface by less than one controller clock period.

16. A memory device comprising:
an array of memory cells;
a capture circuit having an input terminal, an output terminal, and a control terminal, the capture circuit configured to receive a read command at the input terminal, the capture circuit further configured to receive an array access signal at the control terminal and capture the read command responsive to the array access signal;
a delay circuit coupled to the capture circuit, the delay circuit having an input terminal, an output terminal and a control terminal, the delay circuit configured to receive the read command and delay the read command responsive to a delay control signal received at the delay circuit control terminal;
an access circuit coupled to the delay circuit, the access circuit operable to access the array of memory cells at a location corresponding to the read command such that read data is output from the array of memory cells; and
a buffer memory coupled to the array of memory cells and configured to receive data output from the array of memory cells, the buffer memory configured to receive an output control signal and output the read data responsive to the output control signal,
wherein the array access signal includes a pulse having a rising edge and a falling edge, the memory device configured to capture the read command on the rising edge of the pulse, and the delay circuit configured to delay the command until the falling edge of the pulse.

17. The memory device of claim 16 wherein the buffer memory is configured to store an amount of data equal to an amount accessed during the delay of the read command.

18. A method comprising:
receiving a controller clock signal having a controller clock period;
receiving a plurality of read commands including a first and second consecutive read command corresponding to different memory devices sharing an interface for transmission of read data;
transmitting, from a memory controller, the first read command to a first corresponding memory device in a first controller clock period;
transmitting, from the memory controller, a first output control signal to the first corresponding memory device a certain time after transmitting the first read command, the first corresponding memory device configured to place the read data on the interface responsive to the first output control signal;

transmitting, from the memory controller, the second read command to the second corresponding memory device after a delay time of at least one unit time interval and less than one controller clock cycle; and transmitting, from the memory controller, a second output control signal to the second corresponding memory device a time after transmitting the second read command, the second corresponding memory device configured to transmit the read data on the interface responsive to the second output control signal.

19. A method comprising:

receiving a controller clock signal having a controller clock period;

transmitting, from a memory controller, a first read command to a first corresponding memory device in a first controller clock period;

transmitting, from the memory controller, a first output control signal to the first corresponding memory device a certain time after transmitting the first read command, the first corresponding memory device configured to place read data on the interface responsive to the first output control signal;

transmitting, from the memory controller, a second consecutive read command to a second corresponding memory device different than the first memory device in a second consecutive controller clock period; and transmitting, from the memory controller, a second output control signal to the second corresponding memory device a time plus a delay time after transmitting the second read command, the second corresponding memory device configured to place read data on the interface responsive to the second output control signal.

20. The method of claim 19 further comprising transmitting read commands having a second memory device transition including two consecutive read commands directed to different memory devices, the method further comprising:

transmitting a later read command of the second memory device transition to the corresponding memory device; and transmitting a third output control signal to the corresponding memory device of the later read command a certain time plus two delay times after transmitting the later read command.

21. The method of claim 20 further comprising transmitting read commands having a third and fourth memory device transition, each including two consecutive read commands directed to different memory devices, the method further comprising:

transmitting a later read command of the third memory device transition to the corresponding memory device;

transmitting a fourth output control signal to the corresponding memory device of the later read command of the third memory device transition a certain time plus three delay times after transmitting the later read command;

delaying one controller clock period and then transmitting a later read command of the fourth memory device transition to the corresponding memory device; and transmitting a fifth output control signal to the corresponding memory device of the later read command of the fourth memory device transition the certain time after transmitting the later read command.

22. A method comprising:

receiving a controller clock signal having a controller clock period;

issuing a plurality of read commands having a first memory device transition including two consecutive read commands directed to different memory devices sharing an interface for transmission of data;

transmitting, from a memory controller, a first read command of the first memory device transition to the corresponding memory device in a first controller clock period;

transmitting, from the memory controller, a first array access signal to the corresponding memory device in the first controller clock period, the array access signal having a rising edge and a falling edge, the corresponding memory device configured to capture the first read command and begin accessing a corresponding memory array responsive to the rising edge of the first array signal;

transmitting, from the memory controller, a first output control signal to the first corresponding memory device a certain time after transmitting the rising edge of the first array access signal, the first corresponding memory device configured to place read data on the interface responsive to the first output control signal;

transmitting the second read command of the first memory device transition to the corresponding memory device in a second consecutive controller clock period;

transmitting a second array access signal to the corresponding memory device in the second controller clock period, the second array access signal having a rising edge and a falling edge and transmitting a delay control signal to the corresponding memory device, the corresponding memory device configured, responsive to the delay control signal, to capture the second read command on the rising edge of the second array cycle pulse;

delaying access to the corresponding memory array until at least the falling edge of the second array access signal; and transmitting a second output control signal to the second corresponding memory device the certain time after transmitting the falling edge of the second array access signal, the second corresponding memory device configured to place read data on the interface responsive to the second output control signal.

* * * * *